(12) United States Patent
Hassun

(10) Patent No.: US 7,208,990 B1
(45) Date of Patent: Apr. 24, 2007

(54) LOW NOISE MICROWAVE FREQUENCY SYNTHESIZER HAVING LOOP ACCUMULATION

(75) Inventor: Roland Hassun, San Mateo, CA (US)

(73) Assignee: Giga-Tronics, Inc., San Ramon, CA (US)

( * ) Notice: Subject to any disclaimer, the term of this patent is extended or adjusted under 35 U.S.C. 154(b) by 0 days.

(21) Appl. No.: 11/414,087

(22) Filed: Apr. 28, 2006

(51) Int. Cl.
    *H03L 7/06* (2006.01)
(52) U.S. Cl. .......................... 327/156; 331/16; 331/18; 375/365
(58) Field of Classification Search ........ 327/147–149, 327/156–159; 331/16–18; 375/365
    See application file for complete search history.

(56) References Cited

U.S. PATENT DOCUMENTS

| 3,928,813 A | 12/1975 | Kingsford-Smith |
| 4,516,084 A | 5/1985 | Crowley |
| 4,609,881 A | 9/1986 | Wells |
| 5,028,887 A | 7/1991 | Gilmore |
| 5,038,117 A | 8/1991 | Miller |
| 5,180,993 A * | 1/1993 | Dent ........................... 331/16 |
| 5,351,014 A * | 9/1994 | Ichiyoshi .................... 331/1 A |
| 5,757,239 A | 5/1998 | Gilmore |
| 5,859,570 A | 1/1999 | Itoh et al. |
| 6,198,353 B1 | 3/2001 | Janesch et al. |
| 6,366,174 B1 * | 4/2002 | Berry et al. .................. 331/78 |

\* cited by examiner

*Primary Examiner*—Dinh T. Le
(74) *Attorney, Agent, or Firm*—Menlo Patent Agency LLC; David R. Gildea

(57) ABSTRACT

A frequency synthesizer and a method for synthesizing a microwave output signal frequency. The synthesizer uses a reference signal having a variable frequency and accumulation in feedback of a phase locked loop for synthesizing a microwave output frequency. The feedback accumulation rate is derived from a first seed word and the variable reference frequency is derived from a second seed word. A spur suppressor having arithmetic frequency conversions reduces the levels of in-band spurious signals of the variable reference frequency signal in order to reduce the spurious signal levels in the output signal.

26 Claims, 4 Drawing Sheets

LOW NOISE MICROWAVE FREQUENCY SYNTHESIZER HAVING LOOP ACCUMULATION

BACKGROUND OF THE INVENTION

1. Field of the Invention

The invention relates generally to signal frequency synthesis and more particularly to a frequency synthesizer and a method having feedback loop accumulation derived from a first seed word and a variable reference frequency derived from a second seed word for synthesizing a microwave signal frequency.

2. Description of the Background Art

Microwave frequency synthesizers play a crucial role in consumer, industrial and military applications. They are found in test systems for cell phones, radars and communication transceivers.

The performance, cost and size of a synthesizer has a very substantial impact on commercial success and operational viability in numerous instances. Low phase noise, fine frequency resolution, low spurious signal levels and fast switching speed are key performance factors that in the microwave range heretofore could only coexist in costly, physically large and power-hungry products.

Microwave frequency synthesizer architectures fit into 2 broad categories—direct analog and indirect. The direct analog microwave approach is based on the implementation of simple arithmetic frequency operations with microwave components such as mixers, filters, frequency multipliers, frequency dividers, and signal path switches. The resulting solutions have high performance, but when applied in the microwave frequency range, are costly, bulky and have high power consumption.

Indirect synthesis architectures make use of signal-switching-path phase lock loops (PLL)s. Single switching loop PLL architectures have low cost, small size and low power consumption by virtue of their simplicity. Such simple architectures are currently used in applications that do not require the level of performance demanded in military and high volume test applications. Unfortunately, to meet a high level of performance, complex solutions having multiple phase-locked loops, sometimes as many as 8 or 10, are required in the signal switching path. As a result, the PLL implementations of frequency synthesizers that are capable of meeting demanding performance are also costly, bulky, and have high power consumption.

Phase noise in synthesized output signals using phase lock loop architectures is in great part proportional to the ratio of the output frequency of the phase-locked loop to the input (or reference) frequency. Therefore, a high reference frequency is called for. Unfortunately, the high reference frequency makes it difficult to achieve fine frequency resolution. In order to resolve this difficulty while still achieving low phase noise, fractional N and sigma delta systems are used. However, the phase-locked loops for such systems must be relatively narrow in order to prevent spurious signal sidebands. Unfortunately, the narrow phase-locked loops in the signal switching path cause slow switching speed of the output frequency.

An invention is needed for microwave frequency synthesis having the simplicity of a single switching-path loop with the high performance previously only available with direct analog and multi-loop architectures.

SUMMARY OF THE INVENTION

The present invention uses a reference signal having a variable frequency and accumulation in feedback of a phase locked loop for synthesizing a microwave output frequency. The feedback accumulation rate is derived from a first seed word and the variable reference frequency is derived from a second seed word.

In a preferred embodiment, the present invention is a frequency synthesizer for synthesizing an output frequency, comprising: a feedback accumulator for accumulating a selected first seed word at the rate of the output frequency for updating a feedback word, the feedback word having a most significant bit (MSB); a variable reference generator for synthesizing a variable reference frequency for a reference signal; and an oscillator for providing the output frequency controlled by a phase comparison between the reference signal and an MSB signal corresponding to the MSB, whereby the output frequency is synthesized according to the first seed word and the variable reference frequency. The variable reference frequency is synthesized according to a selected second seed word. The variable reference generator includes a spur suppressor using arithmetic frequency conversions for suppressing spurious signal levels for the reference signal for frequencies other than the variable reference frequency.

In another preferred embodiment, the present invention is a method for synthesizing an output frequency, comprising: synthesizing a variable reference frequency for a reference signal; accumulating a selected first seed word at the rate of the output frequency for updating a feedback word, the feedback word having a most significant bit (MSB); and controlling the output frequency by a phase comparison between the reference signal and an MSB signal corresponding to the MSB, whereby the output frequency is synthesized according to the first seed word and the variable reference frequency. Synthesizing the variable reference frequency includes deriving the reference frequency from a selected second seed word. Synthesizing the variable reference frequency can further include using arithmetic frequency conversions for suppressing spurious signal levels for the reference signal for frequencies other than the variable reference frequency.

The invention combines performance features of low phase noise, fine frequency resolution and fast switching speed with low spurious signal levels.

The invention has the simplicity of having only a single phase lock loop in the signal switching path, thereby providing low cost, small size and low power consumption compared to direct microwave frequency synthesis and multi-loop synthesis techniques for the microwave frequency range.

These and other embodiments and advantages of the present invention will no doubt become obvious to those of ordinary skill in the art after viewing the various drawings and reading the following detailed description of the preferred embodiments for carrying out the invention.

BEST MODE FOR CARRYING OUT THE INVENTION

Figure 1:
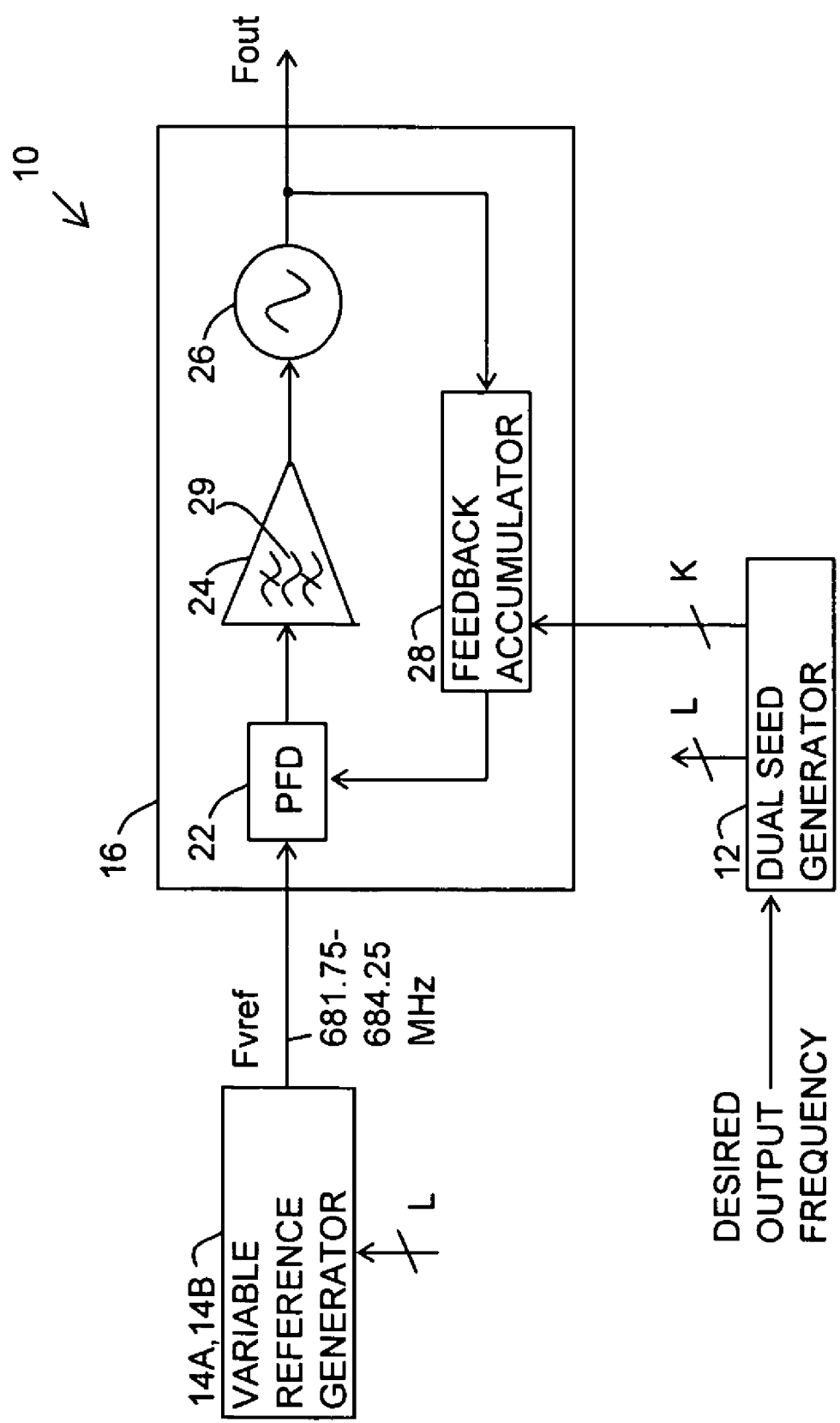
FIG. 1 is a block diagram of a microwave signal frequency synthesizer of the present invention.

The details of the preferred embodiments for carrying out the invention will now be presented. Specific numbers are illustrated in the drawings and described in the detailed descriptions for examples of frequencies, frequency multiplications and frequency divisions. However, it should be understood that the descriptions and illustrations of these details and numerical examples are not intended to limit the invention to these details or numbers. On the contrary the details and numerical examples only describe preferred embodiments for carrying out the idea of the invention. It is expected that alternatives, modifications and equivalents for other embodiments will be apparent to someone skilled in the art as within the scope of the idea.

The details of the preferred embodiments are shown by the figures and accompanying descriptions for providing an output signal in the microwave frequency range. It is appreciated by those skilled in the art that available components and parasitic effects are more limiting for microwave frequencies than for lower frequencies. Therefore, ideas that have been developed for lower frequencies are not necessarily relevant to the microwave art of the present invention. The microwave frequency range is considered to be frequencies greater than one Gigahertz (GHz) up to at least one hundred GHz.

FIG. 1 is a block diagram of a low noise frequency synthesizer of the present invention referred to with a reference number 10. The frequency synthesizer 10 includes a dual seed calculator 12, a variable reference generator 14A or 14B, and an accumulation loop 16. The dual seed calculator 12 uses the desired output frequency Fout with equations or in a lookup table for providing first and second seed words referred to as K and L, respectively.

The variable reference generators 14A and 14B use the second seed word L for synthesizing a reference signal having a variable frequency Fvref. The variable reference frequency Fvref has a center frequency Fxref and a variable interpolation frequency $\Delta f$, where the variable interpolation frequency $\Delta f$ has a range of $\pm \Delta F$. The accumulation loop 16 uses the interpolation frequency $\Delta f$ for fine tuning an output frequency Fout. In a preferred embodiment the variable reference frequency Fvref is 683±1.25 MHz and the output frequency Fout is 5 to 10 GHz.

The accumulation loop 16 includes a phase frequency detector (PFD) 22, an error amplifier 24, a microwave tunable output oscillator 26 and a feedback accumulator 28. The output signal frequency Fout from the oscillator 26 is controlled with a voltage provided by the error amplifier 24. The error amplifier 24 provides the control voltage by amplifying an error voltage from the PFD 22 with an amplification factor that may be shaped according to the control voltage and a known voltage-to-frequency characteristic of the oscillator 26; In a preferred embodiment the oscillator 26 is a Yttrium Iron Garnet (YIG) tuned oscillator (YTO). In an alternative embodiment the oscillator 26 may be a voltage controlled oscillator (VCO) using a tunable frequency device such as the capacitance of a varactor diode or transistor junction.

The error amplifier 24 includes a loop filter 29 for providing stability compensation elements for adding poles and zeroes to the open loop response of the accumulation loop 16 in order to increase the order of the loop 16 and to prevent oscillations of the loop 16. The bandwidth of the loop filter 29 must be low enough to filter the close-in spurious sideband signals from the reference signal and a feedback signal from the accumulator 28, and low enough so that multiplied wide band phase noise in the reference signal is prevented from modulating the oscillator 26. The loop filter 29 bandwidth must be high enough so that the close-in phase noise of the output signal is no more than the multiplied close-in phase noise of the reference signal and high enough to allow fast switching between output frequencies (Fout)'s. The terms "close-in" and "wide band" refer to spectral difference with respect to the output frequency Fout.

The PFD 22 uses exclusive-or gates for comparing phase and frequency of the reference signal to phase and frequency of the feedback signal from the accumulator 28. In a preferred embodiment the PFD 22 reacts to the negative transitions of the reference signal and the feedback signal. When the frequencies are not equal the PFD 22 provides the error voltage to the error amplifier 24 to drive the oscillator 26 until the frequencies are equal. When the frequencies are equal, the PFD 22 provides the error voltage to the error amplifier 24 to control the oscillator 26 to minimize the phase difference between the MSB signal and the feedback signal.

The accumulator 28 effectively divides the output signal frequency Fout by a variable divide factor for providing the feedback signal. Because the PFD 22 compares the reference frequency Fvref to the divided frequency, the divide factor effectively multiplies the reference frequency Fvref to provide the output frequency Fout. The accumulator 28 has a predetermined modulus $2^M$. The divide factor is the accumulator modulus $2^M$ divided by the first seed word K. A model MX1DS10P from Centellax, Inc. of Santa Rosa, Calif., can be used in the construction of such accumulator 28.

The output signal of the oscillator 26 is used by the accumulator 28 as a clock signal. The accumulator 28 uses the clock signal with the first seed word K and the accumulator modulus $2^M$ for providing an accumulation value. The accumulation value has bit length of M having a most significant bit (MSB) and less significant bits (LSB)s. The accumulation value is used for a feedback word. The MSB of the feedback word is used for the feedback signal to the PFD 22.

In operation, the accumulator 28 starts a cycle with the LSBs of the accumulation value. At each cycle of the clock signal the accumulator 28 adds (accumulates) the first seed word K to the accumulation value. The first seed word K is accumulated one or several times on top of the previous accumulation value until the accumulation value reaches or exceeds the value of the accumulator modulus $2^M$. When the value of the accumulator modulus $2^M$ is reached or exceeded the MSB of the accumulation value overflows. At the MSB overflow, the LSBs become the accumulation value and the cycle is begins again. The frequency of the feedback signal is the frequency of the MSB overflows.

The accumulator 28 adds the first seed word K to the accumulation value indefinitely at the stroke of the accumulator clock signal from the YTO 28. This functionality yields a feedback signal having steps at the clock rate equal to the output frequency Fout. The average frequency of the feedback signal (MSB overflow frequency) is directly proportional to the output frequency Fout and the size of the word K being accumulated and inversely proportional to the accumulator modulus $2^M$. Using the first seed word K, the average frequency of the feedback signal is the output frequency Fout times the first seed word K divided by the accumulator modulus $2^M$.

The largest value that the first seed word K can take is slightly less than one-half the accumulator modulus $2^M$. This means that the average MSB overflow frequency has a range of the output frequency Fout divided by the accumulator modulus $2^M$ (for K=1) to slightly less than one-half of the output frequency Fout (for K slightly less than $\frac{1}{2} \times 2^M$).

The feedback signal is passed from the accumulator 28 to the PFD 22 as an MSB signal having a frequency and phase corresponding to the changes of the MSB of the feedback word. The MSB signal may be the MSB bit having alternate high and low states or a pulse that is triggered by transitions of the MSB bit. The pulse may be triggered when the MSB overflows (transitions from a high to a low state) or when the MSB increments (transitions from a low to a high state). The PFD 22 may be constructed to react to the central energy of the MSB signal, or to a high to low transition of the MSB signal, or a low to high transition of the MSB signal, or a combination of the high to low and low to high transitions.

The MSB signal has the precise average frequency that is determined by the output frequency Fout clock signal, the first seed word K and the accumulator modulus $2^M$, but the spectrum of the MSB signal includes spurious signals around the desired frequency. The accumulation loop 16 filters the spurious signals by an amount determined by the spectral (frequency) separation ΔSS between the desired frequency and the spurious frequency; and the filtering action from the bandwidth of the closed loop response of the accumulation loop 16. The loop filter 29 primarily determines this bandwidth. In a preferred embodiment the bandwidth is about fifty KHz. The spectral separation ΔSS and the bandwidth are judicially designed so that the spectral separation ΔSS is about five to ten times the bandwidth of the accumulation loop 16.

Figure 2:
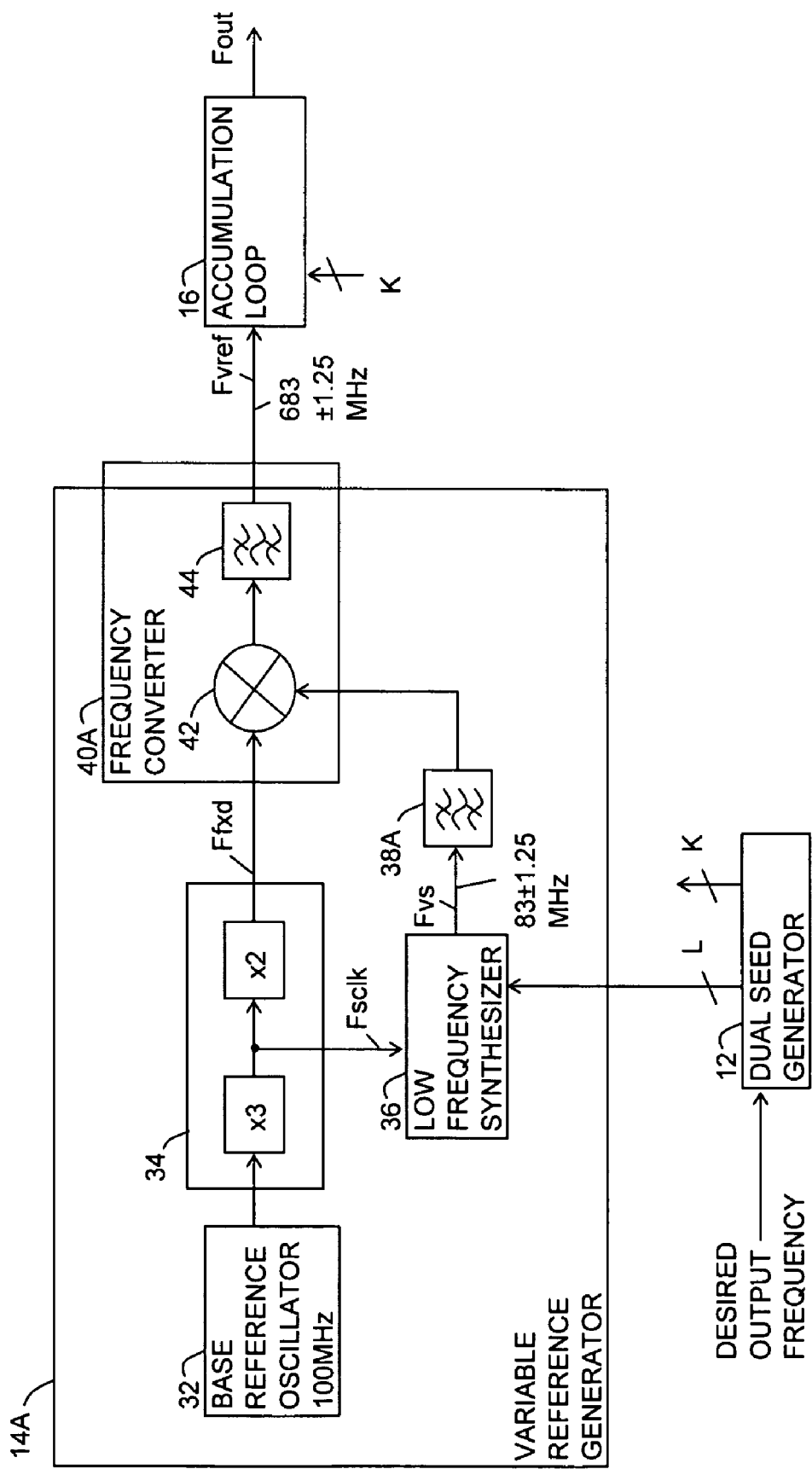
FIG. 2 is a block diagram of a first embodiment of a variable reference generator for the frequency synthesizer of FIG. 1.

FIG. 2 is a block diagram of the variable reference generator 14A of the present invention. The variable reference generator 14A includes a base reference oscillator 32, a base frequency multiplier 34, a low frequency (LF) synthesizer 36, a lowpass or bandpass filter 38A, and a frequency converter 40A. The frequency converter 40A includes a reference mixer 42 and a bandpass filter 44. The base reference oscillator 32 operates with a resonator for providing a base signal. In a preferred embodiment the resonator is a crystal for providing a base frequency of 100 MHz.

The frequency multiplier 34 includes one or more frequency multipliers for multiplying the base frequency to one or more fixed conversion frequencies. In a preferred embodiment, a times-three multiplier multiplies the base frequency by three for providing a first conversion frequency Fsclk as a clock signal for the LF synthesizer 36; and a times-two multiplier multiplies the first conversion frequency by two for providing a second conversion frequency to the frequency converter 40A as an upconversion translation signal. It should be noted that other frequency multiplication schemes may equally well be used. A diode limiter and filter can be used for the times-three multiplier. A diode rectifier and filter can be used for the times-two multiplier. Amplifiers may also be required.

The LF synthesizer 36 preferably uses direct digital synthesis from the frequency Fsclk of the LF synthesis clock signal and the second seed word L for synthesizing a low frequency synthesized signal, also known herein as the first signal, having a variable synthesized frequency Fvs. The direct digital synthesis in the synthesizer 36 uses a numerically controlled oscillator (NCO), a sine lookup table, and a digital-to analog converter (DAC). The NCO increments digital values by repeatedly adding a digital word, the sine lookup table shapes the NCO digital values to a sinusoidal digital signal and the DAC converts the digital signal to an analog signal. The NCO, sine lookup table and DAC provide fine frequency resolution without the use of phase or frequency lock loops and provide fast frequency switching for a low frequency synthesized signal.

The synthesized frequency Fvs has the variable interpolation frequency Δf about a certain center frequency Fxs. The filter 38A filters out-of-band (outside the range of Fvs) and unwanted sideband signals from the low frequency synthesized signal and passes the filtered signal to the frequency converter 40A. In a preferred embodiment the frequency band of the low frequency synthesized signal Fvs is 83±1.25 MHz. The design of the filter 38A has special attention to eliminating an unwanted sideband in the frequency band of Fsclk–Fvs, equal to 217±1.25 MHz in this embodiment.

The fineness of the frequency resolution of the synthesizer 10 with the variable reference generator 14A is (Fout/Fvref)×(Fsclk/$2^{Md}$). The number of bits Md is the lower of the number of bits of resolution of the second seed word L and number of bits of resolution of the LF synthesizer 36. In a preferred LF synthesizer 36 uses a model AD9854 from Analog Devices, Inc., of Norwood, Mass., and the number of bits Md is forty-eight.

The mixer 42 mixes the filtered low frequency synthesized signal with the upconversion signal from the frequency multiplier 34 and passes a mixer signal to the bandpass filter 44. The mixer signal has signal components at the sum and difference of the frequencies of the upconversion and low frequency synthesized signals. The bandpass filter 44 filters the mixer signal for selecting either the sum or the difference frequency and filtering the other. In the preferred embodiment the reference bandpass filter 44 passes the signal component for the frequency sum to the accumulation loop 16 as the reference signal having the variable reference frequency Fvref.

Figure 3:
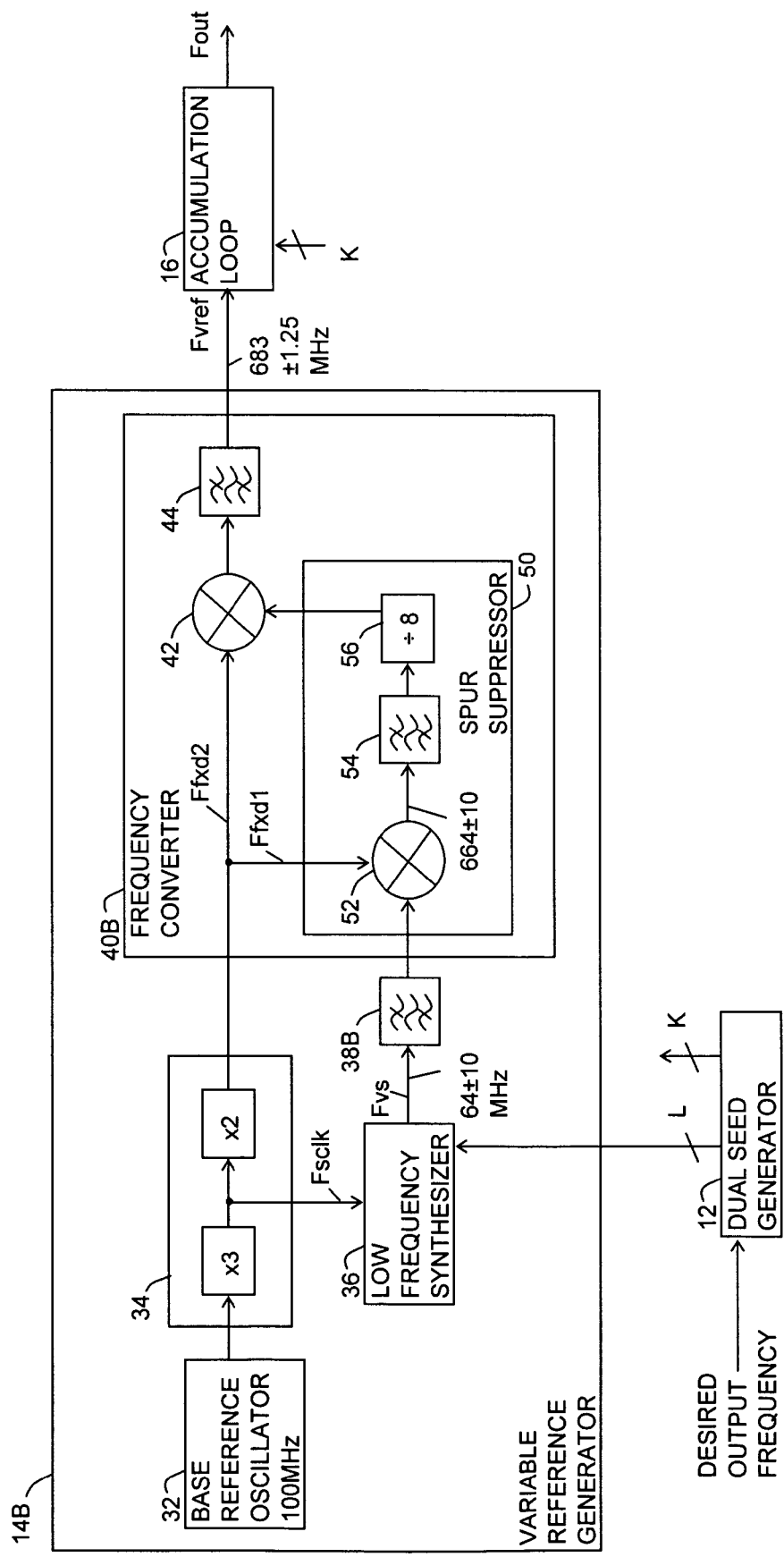
FIG. 3 is a block diagram of a second embodiment of a variable reference generator for the frequency synthesizer of FIG. 1 having lower spurious signal levels.

FIG. 3 is a block diagram of the variable reference generator 14B of the present invention. The variable reference generator 14B includes the base reference oscillator 32, the base frequency multiplier 34, the low frequency (LF) synthesizer 36, a lowpass or bandpass filter 38B, and a frequency converter 40B. The frequency converter 40B includes the first mixer 42, the bandpass filter 44, and a spur suppressor 50. The spur suppressor 50 includes an intermediate mixer 52, a bandpass filter 54 and a frequency divider 56. The LF synthesizer 36 passes the synthesized signal to the filter 38B. The filter 38B filters out-of-band spurious and unwanted sideband signals from the synthesized signal and passes the filtered synthesized signal to the intermediate mixer 52.

The mixer 52 mixes the filtered synthesized signal from the LF synthesizer 36 with the upconversion signal from the frequency multiplier 34 and passes a mixer signal to the bandpass filter 54. The mixer signal has signal components at the sum and difference of the frequencies of the upconversion and low frequency synthesized signals. The bandpass filter 54 filters the mixer signal for selecting either the sum or the difference frequency and filtering the other. In the preferred embodiment the bandpass filter 54 passes the signal component for the frequency sum to the frequency divider 56.

The frequency divider 56 divides the signal by a factor N and passes the frequency divided signal to the mixer 42. The mixer 42 and the bandpass filter 44 upconvert and filter the signal as described above for providing the reference signal having the variable reference frequency Fvref to the accumulator loop 16. In a preferred embodiment the divide factor N is eight and the variable frequency Fvs of the low frequency synthesized signal is 64±10 MHz. In this embodiment the filter 38B filters the out-of-band spurious signals with special attention to eliminating an unwanted sideband in the frequency band Fsclk–Fvs of 226 MHz to 246 MHz. The frequency range of the frequency divided signal is 83±1.25 MHz.

The effect of the spur suppressor 50 is to suppress or reduce the levels by the divide factor N of the in-band spurious signals with respect to the level of the desired low frequency synthesized signal without using a narrow band filter or phase lock loop. The ratio of the levels of the in-band spurious signals to the level of the desired signal at the output of the spur suppressor 52 is 1/N times the ratio of the levels of the in-band spurious signals to the level of the desired signal at the input of the spur suppressor 50. For a preferred divide factor N of eight, the in-band spurious signals are reduced by about 18 dB. The fine frequency resolution of the synthesizer 10 with the variable reference generator 14B is (Fout/Fvref)×(Fsclk/$2^M$d)/N where Md is the number of bits of frequency resolution of the second seed word L and the LF synthesizer 36.

Figure 4:
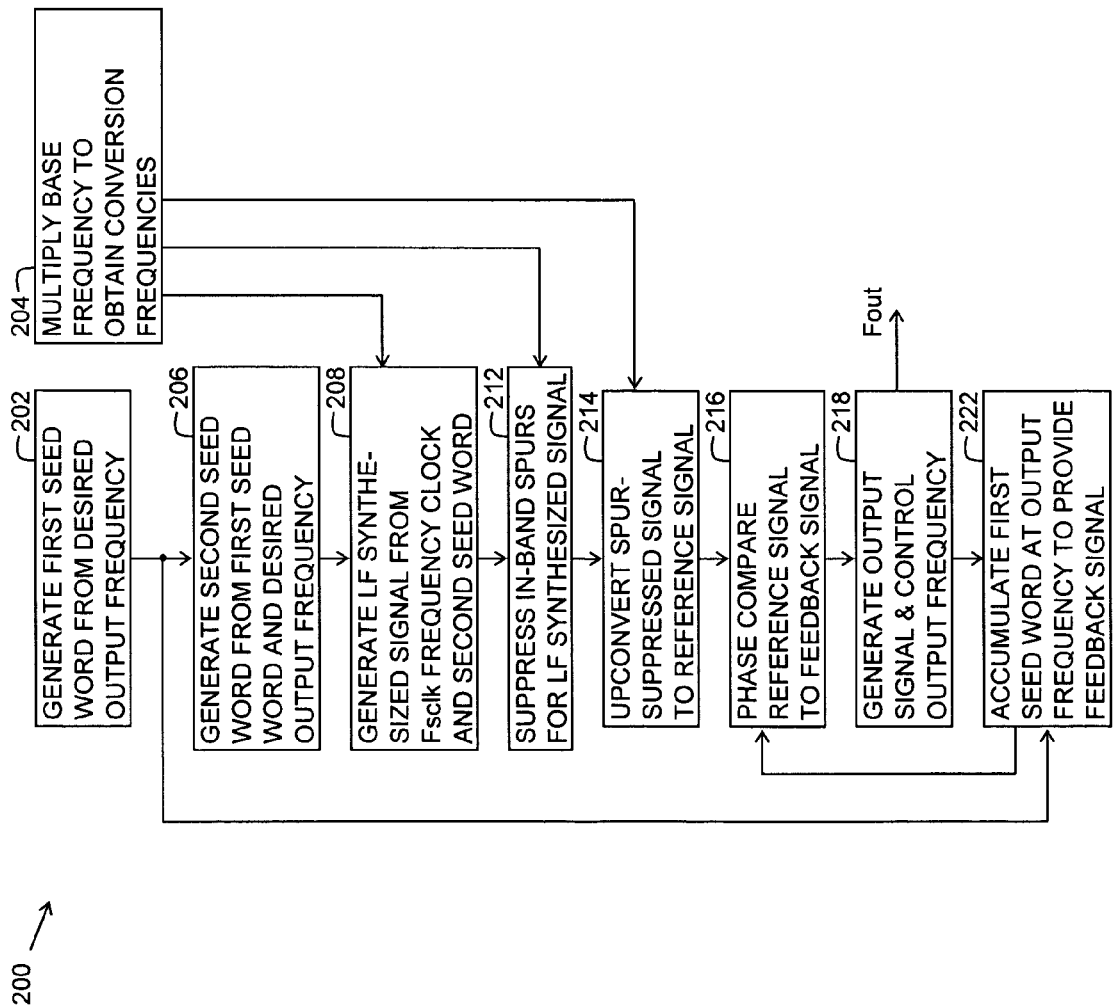
FIG. 4 is a flow chart of a method of the present invention for synthesizing a microwave signal frequency.

FIG. 4 is a flow chart of a method of the present invention for synthesizing a desired frequency of an output signal. A tangible medium 200 can be constructed as an article of manufacture that contains a set of instructions in a form that is readable by a computer for guiding a frequency synthesizer to carry out one or more steps of this method for synthesizing the desired output frequency.

The first seed word K for coarse frequency tuning is generated from the desired output frequency Fout and several fixed frequency constants in a step 202. In a step 204 the base reference signal is frequency multiplied to one or more fixed conversion frequencies for providing conversion signals. In a step 206 the second seed word L for fine frequency tuning is generated based on the first seed word K, the desired output frequency Fout and several fixed frequency constants. In a step 208 a conversion signal from the step 204 is used as a low frequency synthesis clock. The low frequency synthesis clock is used with the second seed word L for direct synthesis of a low frequency synthesized signal, also known herein as a first signal, having a variable frequency Fvs. The out-of-band (outside the range of the variable frequency Fvs) signals are filtered.

The in-band spurious signals (inside the range of the variable frequency Fvs) are suppressed from the synthesized signal in a step 212 using a conversion signal from the step 204. The conversion signal is mixed with the filtered synthesized signal to upconvert the filtered low frequency synthesized signal to an intermediate (higher) frequency. Then the intermediate frequency signal is frequency divided down to a lower frequency for providing a spur-suppressed synthesized signal. In a step 214 the spur-suppressed synthesized signal is frequency upconverted to the reference signal at the variable reference frequency Fvref. A conversion signal from the step 204 is mixed with the spur-suppressed synthesized signal for the frequency upconversion.

The reference signal is phase compared to a feedback signal in a step 216. In a step 218 an output signal is generated and the phase comparison is used for controlling the frequency Fout of the output signal. Then, in a step 222 the first seed word K from the step 202 is accumulated at the rate of the output frequency Fout for providing a feedback word and the MSB of the feedback word is used for generating the feedback signal for phase comparison of the step 216.

Single Loop in Signal Switching Path

The signal switching path is the path where the frequency of the signal must be switched in order to change the output frequency Fout. The signals in the signal switching path must have fast switching in order to provide fast switching in the output frequency Fout. The signal switching path of the present invention includes the dual seed calculator 12, the LF synthesizer 36, the filter 38A or 38B, the SSB frequency converter 40A or 40B (including the spur suppressor 50), and the accumulator loop 16. The base reference oscillator 32 and the frequency multiplier 34 are not part of the signal switching path. The accumulator loop 16 is the only phase lock loop in the signal switching path of the present invention.

Therefore, the apparatus of the present invention is termed a single loop synthesizer. The significance of whether a phase lock loop is in the signal switching path is that phase lock loops in the signal switching path inevitability degrade the switching speed; and require more cost, size and power in order to minimize that degradation, than a loop that is not in the signal switching path. The frequency synthesizer 10 has a switching time less than two-hundred microseconds for phase settling within one-tenth radian.

Calculating the First Seed Word K and Resolution ΔK

The first seed word K sets the coarse frequency resolution and the second seed word L sets the fine frequency resolution. The dual seed calculator 12 generates (calculates or uses a table look up based on previous calculations) the first and second seed words K and L based on the desired output frequency Fout and several fixed frequency constants of the frequency synthesizer 10 in order to provide the desired output frequency Fout.

An equation 1 shows a calculation of the first seed word K as a function of the desired output frequency Fout, the accumulator modulus $2^M$, and the center frequency Fxref of the reference signal.

$$K = Fxref * 2^M / Fout \qquad 1$$

An equation 2 shows a calculation of the first seed word K as an integer with a selected incremental resolution ΔK.

$$K = \text{integer} \{[(Fxref * 2^M / Fout) + \Delta K/2]/\Delta K\} * \Delta K \qquad 2$$

In the equation 2, K is the first seed word as an integer; ΔK is the incremental resolution of the first seed word K; Fxref is the center of the variable reference frequency Fvref; $2^M$ is the accumulator modulus; and Fout is the output frequency. The term ΔK/2 is used for centering the first seed word K.

The integer resolution ΔK is selected based on a desired spectral separation ΔSS between the average frequency of the feedback signal and the spurious frequencies due to the phase steps of the clocking of the accumulator 28 at the output frequency Fout. It should be noted that the frequency of the feedback signal is the MSB frequency of the accumulation value and that the average frequency of the feedback signal is the same as the average frequency of the reference signal for each output frequency Fout. An equation 3 shows a selection for the integer resolution ΔK as a function of the minimum spectral separation ΔSS.

$$\Delta K = \Delta SS * 2^M / Fout \quad \quad 3$$

In the equation 3, ΔK is the incremental resolution of the first seed word K; ΔSS is a minimum spectral separation for the accumulation spurs with respect to the average frequency of the MSB; Fxref is the center of the variable reference frequency; and $2^M$ is the accumulator modulus.

The maximum spectral separation occurs for the maximum Fout. The resolution ΔK is computed using the maximum Fout and rounding to a power of two. In a preferred embodiment the accumulator modulus $2^M$ is $2^{20}$ for M=twenty bits of accumulation for the feedback word and the resolution ΔK is 256 or $2^8$. In a preferred embodiment the first seed word K has a range of 71680 to 143360 for a desired output frequency Fout of 5000 to 10000 MHz and a center frequency Fxref of 683 MHz for the reference signal.

Calculating the Second Seed Word L

The LF synthesizer 36 operates with a low frequency (LF) modulus $2^{ML}$ corresponding to ML bits, a low frequency synthesis clock rate Fsclk and the second seed word L for synthesizing the low frequency synthesized signal at the variable frequency Fvs. An equation 4A shows the calculation of the second seed word L in the variable reference generator 14A.

$$L = Fvs * 2^{ML} / Fsclk \quad \quad 4A$$

An equation 4B shows the calculation of the second seed word L in the variable reference generator 14B.

$$L = N * Fvs * 2^{ML} / Fsclk \quad \quad 4B$$

In the equation 4B, the factor N is the divide factor of the frequency divider 56. In a preferred embodiment the clock rate Fsclk is 300 MHz and the divide factor N is eight.

For the variable reference generator 14A, an equation 5A shows the output frequency Fout as a function of the first and second seed words K and L, the accumulator modulus $2^M$, the clock rate Fsclk, and a conversion frequency Ffxd. The conversion frequency Ffxd is the frequency of the conversion signal for upconverting the variable frequency Fvs to the variable reference frequency Fvref. In a preferred embodiment the frequency Ffxd is 600 MHz.

$$Fout = [(L*Fsclk/2^{ML}) + Ffxd)] * (2^M/K) \quad \quad 5A$$

For the variable reference generator 14B, an equation 5B shows the output frequency Fout as a function of the first and second seed words K and L, the accumulator modulus $2^M$, the clock rate Fsclk, a conversion frequency Ffxd1, a conversion frequency Ffxd2, and the divide factor N.

$$Fout = \{[(L*Fsclk/2^{ML}) + Ffxd1)]/N + Ffxd2\} * (2^M/K) \quad \quad 5B$$

The conversion frequency Ffxd1 is the frequency of the conversion signal used in the spur suppressor 50 for frequency upconverting the low frequency synthesized signal in the mixer 52 to an intermediate frequency and the conversion frequency Ffxd2 is the frequency of the conversion signal used by the mixer 42 for frequency upconverting the spur-suppressed synthesized signal from the frequency divider 56 to the variable reference frequency Fvref. In a preferred embodiment the divide factor N is eight and the frequencies Ffxd1 and Ffxd2 are 600 MHz.

The equations 5A and 5B can be re-arranged as equations 6A and 6B.

$$L = [Fout*(K/2^M) - Ffxd]*(2^{ML}/Fsclk) \quad \quad 6A$$

$$L = \{N*[Fout*(K/2^M) - Ffxd2] - Ffxd1\}*(2^{ML}/Fsclk) \quad \quad 6B$$

Arithmetic Frequency Conversion

The term "direct frequency conversion" is used herein to mean arithmetic operations on the frequency of a signal by frequency multiplication (including division) and frequency translation. Frequency multiplication or division is accomplished with a frequency multiplier or frequency divider. Frequency translation may be accomplished with a mixer by mixing two signals. The mixing product of the two signals includes output signals at the sum and difference of the frequencies of the two signals that are mixed. A bandpass filter is normally employed to select one of the signal frequencies and reject the other. Frequency translation can be used for upconverting or downconverting a frequency.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering the alterations and modifications as fall within the true spirit and scope of the invention.

What is claimed is:

1. A frequency synthesizer for synthesizing an output frequency, comprising:
   a feedback accumulator for accumulating a first seed word at said output frequency for updating a feedback word having a most significant bit (MSB) at an output of the feedback accumulator, wherein said first seed word is based on a desired said output frequency;
   a variable reference generator for synthesizing a variable reference frequency for a reference signal;
   an oscillator for providing said output frequency controlled by a phase comparison between said reference signal and an MSB signal corresponding to changes in said MSB; and wherein:
   said variable reference frequency is synthesized according to a second seed word based on said desired output frequency.

2. The frequency synthesizer of claim 1, wherein:
   the variable reference generator includes a spur suppressor using arithmetic frequency conversions for suppressing spurious signal levels for said reference signal for frequencies other than said variable reference frequency.

3. The frequency synthesizer of claim 2, wherein:
   said spur suppressor includes an intermediate frequency translator for frequency translating a first signal at a synthesized first frequency to an intermediate signal at a variable intermediate frequency, and a frequency divider for dividing said intermediate frequency for providing a second signal at a variable second frequency, said variable reference frequency based on said variable second frequency.

4. The frequency synthesizer of claim 3, wherein:
   the variable reference generator further includes a reference frequency translator for frequency translating said second signal from said variable second frequency to said reference signal at said variable reference signal.

5. The frequency synthesizer of claim 1, wherein:
the variable reference generator includes a low frequency synthesizer using said second seed word for generating a first signal having a synthesized first frequency; and a frequency converter for converting said synthesized first frequency to said variable reference frequency.

6. The frequency synthesizer of claim 5, wherein:
the variable reference generator further includes at least one frequency multiplier for frequency multiplying a base frequency to at least one conversion signal having a conversion frequency;
said low frequency synthesizer uses a first said conversion signal with said second seed word for synthesizing said synthesized first frequency; and
said frequency converter uses said at least one conversion signal for frequency conversion of said synthesized first frequency to said variable reference frequency.

7. The frequency synthesizer of claim 6, further comprising:
a seed calculator for using said desired output frequency, at least one said conversion frequency, and an accumulator modulus of the feedback accumulator for generating said first seed word.

8. The frequency synthesizer of claim 7, wherein:
the seed calculator generates said first seed word according to $$K = Fxref * 2^M / Fout$$

where K is said first seed word; Fout is said desired output frequency; Fxref is a center frequency of said variable reference frequency; and $2^M$ is said accumulator modulus.

9. The frequency synthesizer of claim 8, wherein:
the seed calculator further generates said first seed word according to:

$$K = \text{integer}\{[(Fxref * 2^M / Fout) + \Delta K/2]/\Delta K\} * \Delta K$$

where K is said first seed word as an integer and $\Delta K$ is an incremental resolution of said first seed word K.

10. The frequency synthesizer of claim 7, wherein:
the seed calculator is a dual seed calculator using said desired output frequency, said first seed word, an accumulator modulus of the feedback accumulator, said at least one conversion frequency, and a low frequency modulus of said low frequency synthesizer for synthesizing said synthesized first frequency.

11. The frequency synthesizer of claim 10, wherein:
said dual seed calculator generates said second seed word according to:

$$L = [Fout*(K/2^M) - Ffxd]*(2^{ML}/Fsclk)$$

where L is said second seed word; K is said first seed word K; Fout is said desired output frequency; Fsclk is said first conversion frequency; Ffxd is one said conversion frequency; $2^M$ is said accumulator modulus; and $2^{ML}$ is said low frequency modulus.

12. The frequency synthesizer of claim 10, wherein:
the frequency converter includes a frequency divider for frequency dividing an intermediate signal having a variable intermediate frequency by a divide factor for providing a variable second frequency where said intermediate frequency is based on said synthesized first frequency and where said variable reference frequency is derived from said variable second frequency; and
the seed calculator uses said divide factor for generating said second seed word.

13. The frequency synthesizer of claim 12, wherein:
said dual seed calculator generates said second seed word according to:

$$L = \{N*[Fout*(K/2^M) - Ffxd2] - Ffxd1\}*(2^{ML}/Fsclk)$$

where L is said second seed word; K is said first seed word K; Fout is said desired output frequency; Fsclk is said first conversion frequency; Ffxd1 is one said conversion frequency; Ffxd2 is one said conversion frequency; $2^M$ is said accumulator modulus; $2^{ML}$ is said low frequency modulus; and N is said divide factor.

14. A method for synthesizing an output frequency, comprising:
synthesizing a variable reference frequency for a reference signal;
accumulating a first seed word at said output frequency for updating a feedback word having a most significant bit (MSB) at an output of a feedback accumulator, said first seed word based on a desired said output frequency;
controlling said output frequency by a phase comparison between said reference signal and an MSB signal corresponding to changes in said MSB; and wherein:
synthesizing said variable reference frequency includes deriving said reference frequency from a second seed word based on said desired output frequency.

15. The method of claim 14, wherein:
synthesizing said variable reference frequency includes using arithmetic frequency conversions for suppressing spurious signal levels for said reference signal for frequencies other than said variable reference frequency.

16. The method of claim 15, wherein:
using said arithmetic frequency conversions for suppressing said spurious signal levels includes:
frequency translating a first signal at a synthesized first frequency to an intermediate signal at a variable intermediate frequency; and
frequency dividing said intermediate frequency by a divide factor for providing a second signal at a variable second frequency, said variable reference frequency based on said variable second frequency.

17. The method of claim 16, wherein:
synthesizing said variable reference frequency further includes frequency translating said second signal from said variable second frequency to said reference signal at said variable reference signal.

18. The method of claim 14, wherein:
synthesizing said variable reference frequency includes:
using said second seed word for generating a first signal having a synthesized first frequency; and
frequency converting said synthesized first frequency to said variable reference frequency.

19. The method of claim 18, wherein:
synthesizing said variable reference frequency further includes frequency multiplying a base frequency to at least one conversion signal having a conversion frequency; and synthesizing said synthesized first frequency using a first said conversion signal with said second seed word; and frequency converting includes using said at least one conversion signal for frequency conversion of said synthesized first frequency to said variable reference frequency.

20. The method of claim 19, further comprising:
generating said first seed word based on said desired output frequency, at least one said conversion frequency, and an accumulator modulus of the feedback accumulator.

21. The method of claim 20, wherein:
generating said first seed word includes generating said first seed word according to $$K = Fxref * 2^M / Fout$$

where K is said first seed word; Fout is said desired output frequency; Fxref is a center frequency of said variable reference frequency; and $2^M$ is said accumulator modulus.

22. The method of claim 21, wherein:
generating said first seed word further includes generating said first seed word according to:

$$K = \text{integer}\{[(Fxref * 2^M / Fout) + \Delta K/2] / \Delta K\} * \Delta K$$

where K is said first seed word as an integer and ΔK is an incremental resolution of said first seed word K.

23. The method of claim 20, further comprising:
generating said second seed word using said desired output frequency, said first seed word, said accumulator modulus, said at least one conversion frequency, and a low frequency modulus used with said first conversion signal for synthesizing said synthesized first frequency.

24. The method of claim 23, wherein:
generating said second seed word includes generating said second seed word according to:

$$L = [Fout*(K/2^M) - Ffxd]*(2^{ML}/Fsclk)$$

where L is said second seed word; K is said first seed word K; Fout is said desired output frequency; Fsclk is said first conversion frequency; Ffxd is one said conversion frequency; $2^M$ is said accumulator modulus; and $2^{ML}$ is said low frequency modulus.

25. The method of claim 23, wherein:
frequency converting includes frequency dividing an intermediate signal having a variable intermediate frequency by a divide factor for providing a variable second frequency where said variable intermediate frequency is based on said synthesized first frequency and where said variable reference frequency is derived from said variable second frequency; and
generating said second seed word includes using said divide factor for generating said second seed word.

26. The method of claim 25, wherein:
generating said second seed word further includes generating said second seed word according to:

$$L = \{N*[Fout*(K/2^M) - Ffxd2] - Ffxd1\}*(2^{ML}/Fsclk)$$

where L is said second seed word; K is said first seed word K; Fout is said output frequency; Fsclk is said first conversion frequency; Ffxd1 is one said conversion frequency; Ffxd2 is one said conversion frequency; $2^M$ is said accumulator modulus; $2^{ML}$ is said low frequency modulus; and N is said divide factor.

* * * * *